(12) United States Patent
Khoo et al.

(10) Patent No.: US 7,772,859 B2
(45) Date of Patent: Aug. 10, 2010

(54) PROBE FOR TESTING SEMICONDUCTOR DEVICES WITH FEATURES THAT INCREASE STRESS TOLERANCE

(75) Inventors: Melvin Khoo, San Gabriel, CA (US); Nim Tea, Orange, CA (US); Ting Hu, Monrovia, CA (US); Zhiyong An, Los Angles, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 53 days.

(21) Appl. No.: 12/042,295

(22) Filed: Mar. 4, 2008

(65) Prior Publication Data
US 2008/0252328 A1 Oct. 16, 2008

Related U.S. Application Data

(63) Continuation-in-part of application No. 11/734,434, filed on Apr. 12, 2007, now Pat. No. 7,589,542, and a continuation-in-part of application No. 11/194,801, filed on Aug. 1, 2005, now Pat. No. 7,362,119.

(51) Int. Cl.
*G01R 31/02* (2006.01)
(52) U.S. Cl. .............................. 324/754; 324/762
(58) Field of Classification Search .............. None
See application file for complete search history.

(56) References Cited

U.S. PATENT DOCUMENTS

| | | | |
|---|---|---|---|
| 6,255,126 B1 | 7/2001 | Mathieu et al. | |
| 6,426,638 B1 | 7/2002 | DiStefano | |
| 6,771,084 B2 * | 8/2004 | Di Stefano | 324/754 |
| 2004/0018752 A1 | 1/2004 | Lee | |
| 2007/0024298 A1 * | 2/2007 | Khoo et al. | 324/754 |

FOREIGN PATENT DOCUMENTS

| | | |
|---|---|---|
| WO | 2007015712 A | 2/2007 |
| WO | 2007015713 A | 2/2007 |
| WO | 2007092591 A1 | 8/2007 |

OTHER PUBLICATIONS

Sep. 10, 2008 International Search Report.

* cited by examiner

*Primary Examiner*—Minh N Tang
(74) *Attorney, Agent, or Firm*—Manuel F. de la Cerra

(57) ABSTRACT

A novel probe design is presented that increases a probe tolerance to stress fractures. The probe includes a base, a torsion element connected to the base, and a second element connected to the torsion element through a union angle. The union angle includes an interface between the torsion element and the second element, and the edge of the interface is shaped to diffuse stress. What is further-disclosed are three features that increase stress tolerance. These features include a various union angle interface edge shapes, pivot cutouts and buffers.

29 Claims, 12 Drawing Sheets

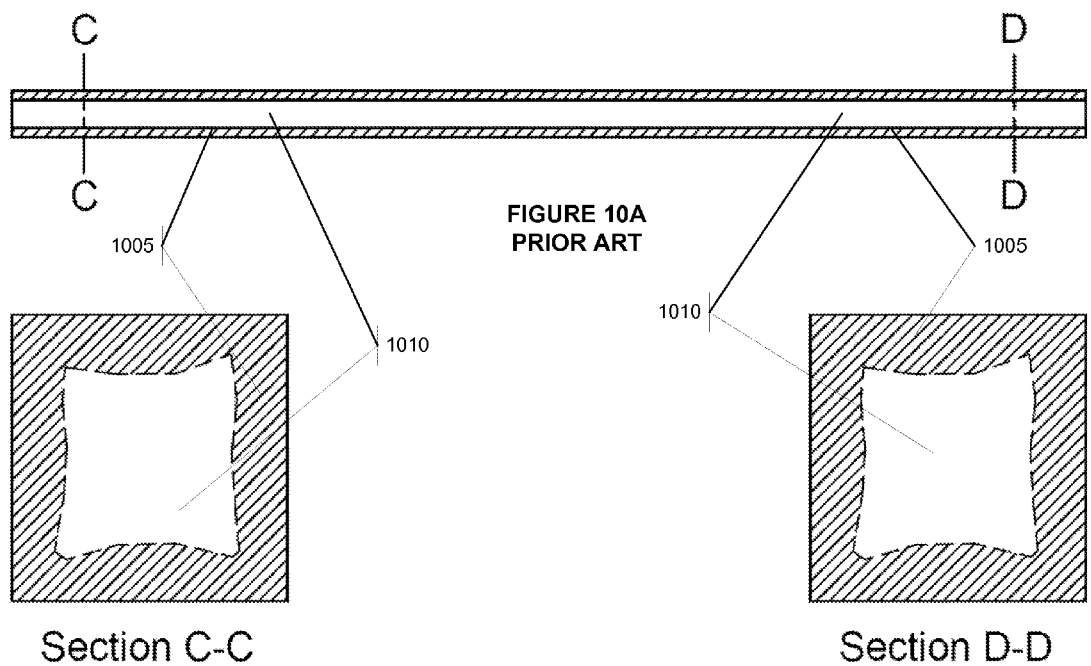
FIGURE 10A
PRIOR ART
FIGURE 10B
PRIOR ART
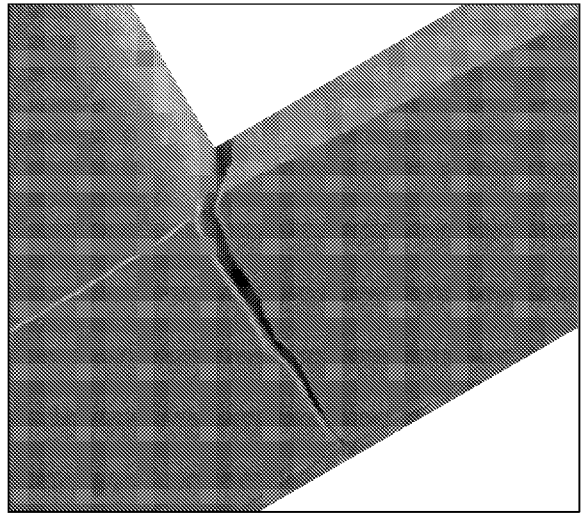
FIGURE 10C

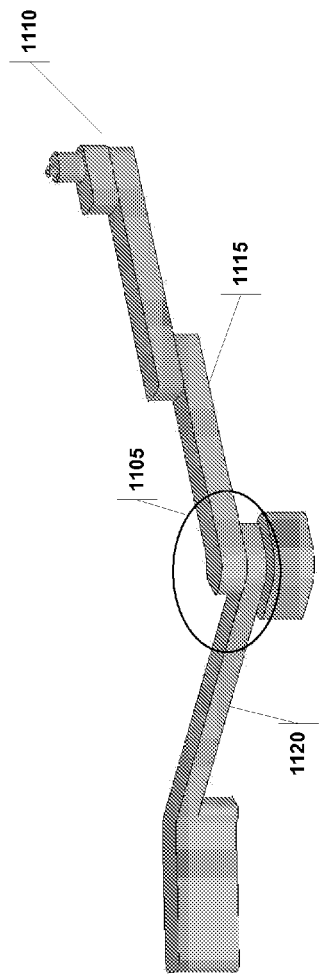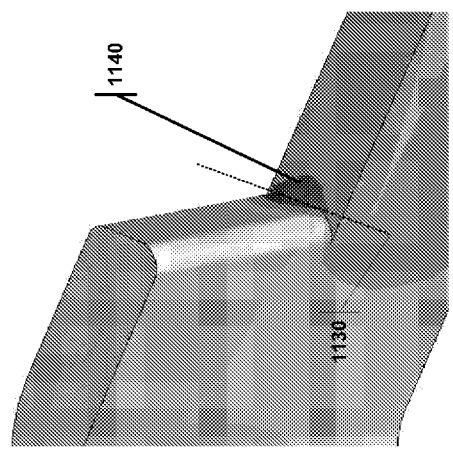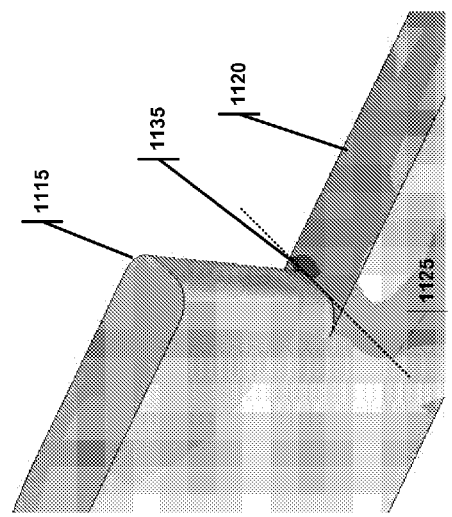
FIGURE 11A
FIGURE 11B
FIGURE 11C

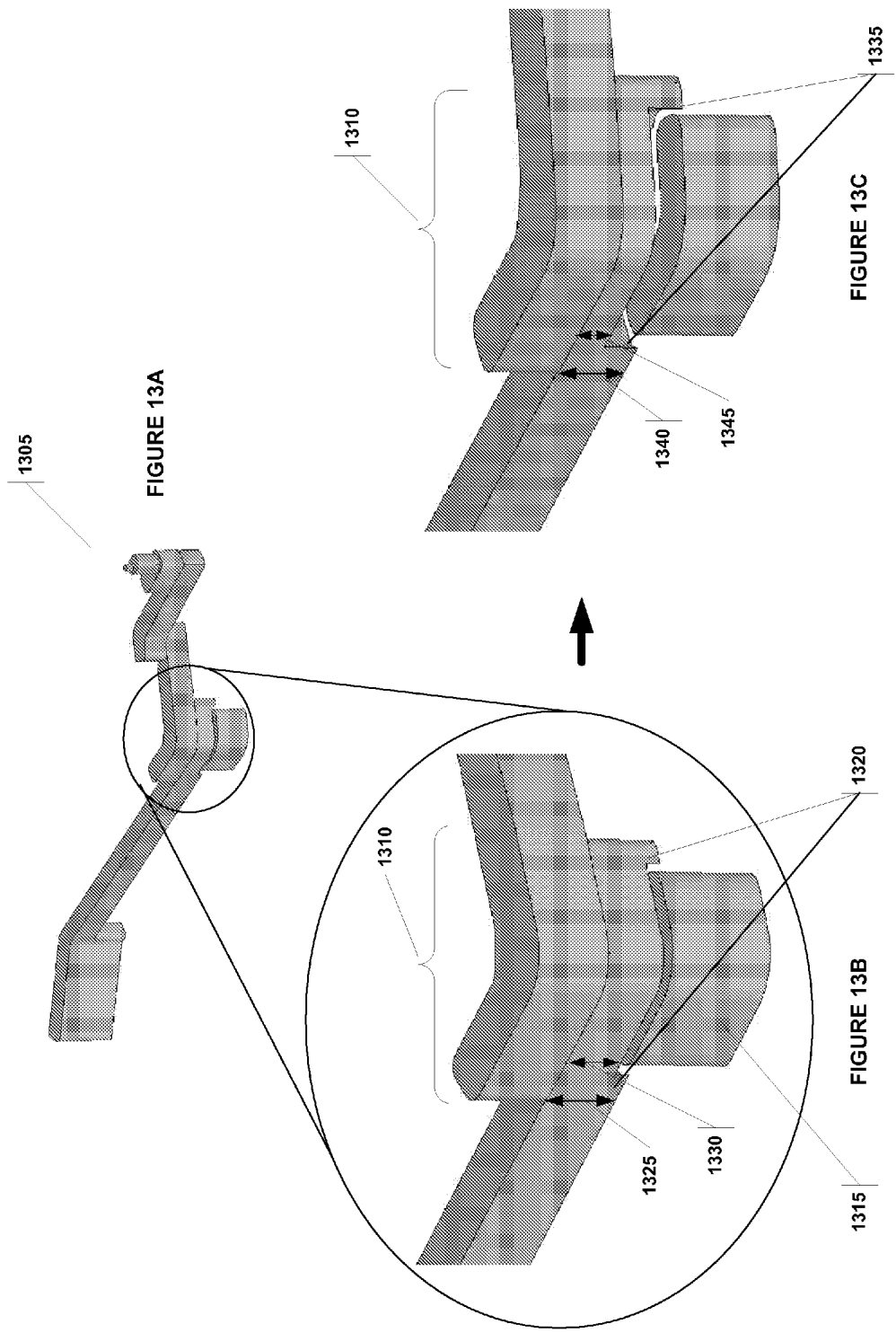

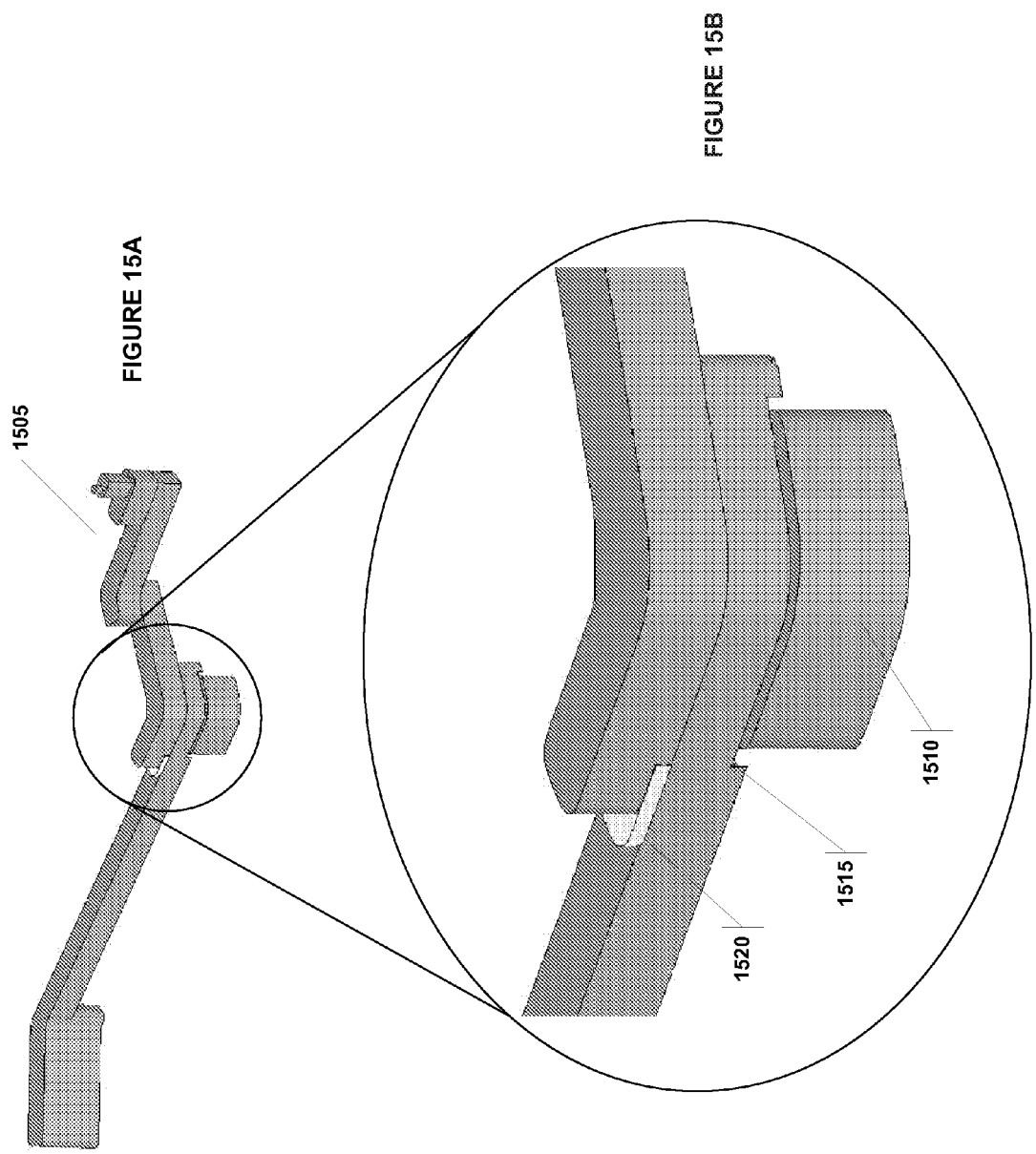

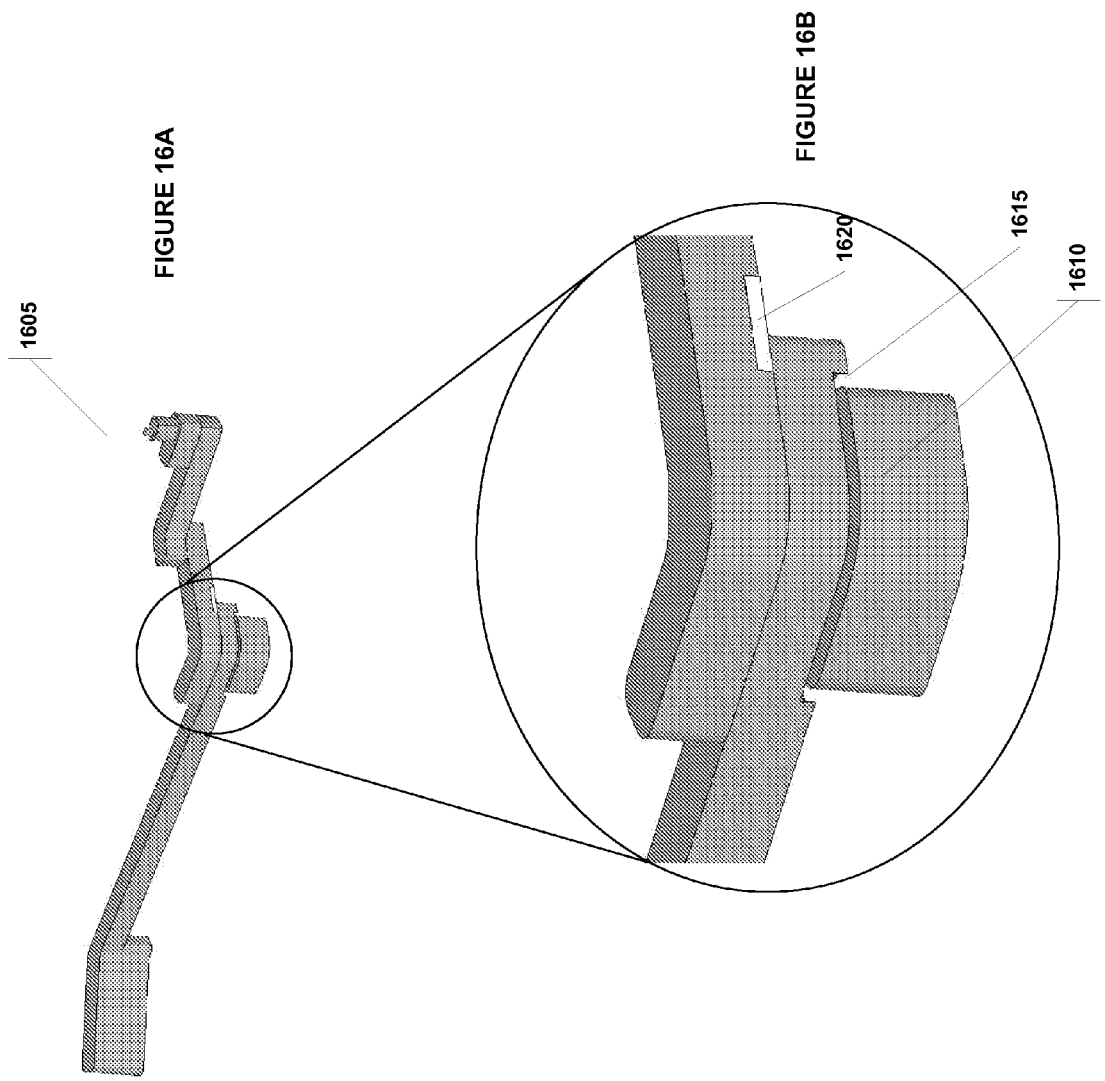

PROBE FOR TESTING SEMICONDUCTOR DEVICES WITH FEATURES THAT INCREASE STRESS TOLERANCE

1. FIELD OF THE INVENTION

The present invention relates to devices for testing semiconductor devices and more particularly to the design of probe contactors for such testing.

2. BACKGROUND OF THE INVENTION

Integrated circuits are made in a bulk parallel process by patterning and processing semiconductor wafers. Each wafer contains many identical copies of the same integrated circuit referred to as a "die." It may be preferable to test the semiconductor wafers before the die is cut into individual integrated circuits and packaged for sale. If defects are detected the defective die can be culled before wasting resources packaging a defective part. The individual die can also be tested after they have been cut into individual integrated circuits and packaged.

To test a wafer or an individual die—commonly called the device under test or DUT—a probe card is commonly used which comes into contact with the surface of the DUT. The probe card generally contains three unique characteristics: (1) an XY array of individual probes that move in the Z direction to allow contact with the die pad; (2) an electrical interface to connect the card to a circuit test apparatus; and (3) a rigid reference plane defined in such a way that the probe card can be accurately mounted in the proper location. When the probe card is brought in contact with the die pad, the Z-direction movement allows for a solid contact with the probe tip. The probe card ultimately provides an electrical interface that allows a circuit test apparatus to be temporarily connected to the DUT. This method of die testing is extremely efficient because many die can be tested at the same time. To drive this efficiency even higher, probe card manufactures are making larger probe cards with an ever-increasing numbers of probes.

Currently two types of probe designs are used to test a semiconductor die —cantilever and torsional. FIGS. 7A and 7B illustrate a conventional cantilever probe. The probe (705) comprises a probe tip (710), a bending element (715), and a probe base (720), which is mounted to a substrate (725). This entire structure is referred to herein as the probe card. The entire probe card is generally moved in the Z-direction (depicted by arrow 730) causing the bending element (715) to bend allowing the probe tip (710) to come into contact with the die pad that is under test. FIG. 7B illustrates how the probe bending element (735) bends while being brought into contact with the die. As an individual probe travels to make contact with the DUT contact pad (this event is called a touchdown), the probe tip scrubs the contact pad, which perfects an electrical contact with the die such that testing can commence. The die contact pads, which are typically aluminum, are often coated with a thin layer of aluminum oxide, or other protective coating, and the probe tip must cut through the coating to perfect the electrical connection. Once testing is complete, the probe (705) is moved away from the die pad and the probe springs back to its original position. Cantilever probes are also known as "free standing resilient springs" or "free standing resilient probes" because they do not employ a pivot or a fulcrum as do torsional probes. U.S. Pat. No. 6,727,580 discloses such a "free standing" probe.

The cantilever design, however, has several shortcomings. Typical cantilever probes are designed with long bending elements, which during touchdown, the probe tip presents a smaller tip contact angle (as compared to the same sized tip on a typical torsion probe design). This results in a larger tip contact area and a larger probe force is thus needed to pierce the aluminum oxide layer. When you multiply this force by the hundreds or thousands of probes on a probe card, the probe card must be engineered to accommodate significant forces, which usually means reinforcing the probe card components, which in turn increases probe card costs.

Another shortcoming is the inefficient distribution of stresses. During touchdown, a cantilever probe bends, which creates stresses on the probe that appear concentrated at the top and bottom surfaces of the bending element near the probe base end of the probe. FIG. 8A illustrates a length-wise cross-sectional view of the stresses experienced by the bending element of a cantilever probe, while FIG. 8B illustrates the width-wise cross-sectional views (Sections A-A and B-B) of the stresses at each end of the element. The left side of the figure, near Section A-A, (indicated by part 805) is the part of the bending element that is near the probe base, with the right side, near Section B-B, (part 810) near the probe tip. The area of the bending element that experiences stresses which are greater than 50% of the maximum stress is shown hatched (815). The corresponding volume of the bending bar that experiences greater than 50% of maximum stress is about 25% of the total cantilever bar volume, and that volume is localized near the probe base (805). The opposite side of the bending bar (810) experiences very low stress. It is clear from FIGS. 8A and 8B that the stress distribution is inefficient because only small portions of the bending element absorb the stress. And it is in these small portions where the probe is more likely to fail forcing manufacturers to widen the bending element at the probe foot to reduce stress and prevent failures. A wider bending element near the probe base, however, adversely affects the packing density of the probe card.

The second type of probe is based on a torsional design which was developed to overcome some of these drawbacks. For example, U.S. Pat. No. 6,426,638 describes a torsion spring design. FIG. 9 illustrates a torsional probe design. As the probe tip (81) comes in contact with the DUT contact pad, it moves flexibly in response to force applied vertically to the tip (81). Vertical movement of the tip (81) depresses the arm (82) and torsionally flexes the torsion element (83) in the direction indicated by arrow (90), as the arm (82) comes into contact with fulcrum or pivot (87). The torsion element (83) serves as a torsional spring, thereby impressing a restoring force on the tip (81).

Torsional designs have some advantages over cantilever designs. Typical torsional probes are designed with short arms, which during touchdown, the probe tip presents a larger tip contact angle (as compared to the same sized tip on a typical cantilever probe design). This results in a smaller tip contact area and a smaller probe force is thus needed to pierce the aluminum oxide layer, which in turn, reduces the overall force exerted by the probe card. Reduced overall force is advantageous because the probe card does not need to be reinforced as much as a comparable cantilever design, thereby reducing manufacturing costs.

Finally, the torsional design more efficiently distributes stress across the entire volume of the torsion element. FIG. 10A illustrates a length-wise cross-sectional view of the stresses experienced by the torsion element, while FIG. 10B illustrates the width-wise cross-sectional views (Sections C-C and D-D) of the stresses at each end of the element. The area of the torsion element that experiences stresses that are greater than 50% of the maximum stress is shown hatched area (1005), with the center of the torsion element (1010) experiencing the least amount of stress. The corresponding volume of the torsion element that experiences greater than 50% of maximum stress is about 60% of the total torsion element volume. Unlike a cantilever design, this stress is experienced throughout the entire length of the torsion element, and it is not localized at the probe base. It is therefore more efficient to make the width of the torsion bar uniform, thereby also improving the packing density.

Unfortunately though, the torsional probe too has drawbacks. First, for a typical torsional design with a shorter geometry of the arm, the scrub length is generally longer which can limit the size of contact pads for the DUTs. Second, again because of the typically shorter geometry of the arm, a small z-deformation in the torsion element can translate into a larger z-shift at the probe tip. This z-deformation may be caused by material fatigue. And third, at the union angle (where the torsional member meets a second element of the probe) there can be significant stress which can cause fractures, and thus, render the probe inoperable. Such a failure is shown in FIG. 10C.

What is needed, therefore, is a probe that exploits the advantages of both the torsional and cantilever probe designs while reducing their associated shortcomings. What is also needed is a probe that reduces operational failure from fractures.

3. SUMMARY OF THE INVENTION

The present disclosure provides a novel probe design for use in a novel probe card that addresses the shortcomings of the prior art by reducing stress fractures. Specifically, in one embodiment, a probe card for testing a semiconductor device comprises a substrate, a probe connected to the substrate and a pivot. The probe comprises a base that is connected to the substrate, a torsion element connected to the base, and a second element connected to the torsion element through a union angle, wherein the union angle comprises an interface between the torsion element and the second element, wherein the edge of the interface is shaped to diffuse stress. The shape of the interface edge may be a plough, a triangle, a taper, a flare and/or combination of these shapes.

In a second embodiment, a probe card for testing a semiconductor device comprises a substrate, a probe connected to the substrate wherein the probe contains a cutout and a pivot connected to the substrate, wherein the pivot contacts the probe at the cutout. The shape of the cutout may be complementary to the shape of the pivot.

In a third embodiment, a probe card for testing a semiconductor device, comprising a substrate, a probe connected to the substrate and a pivot connected to the substrate. The probe further comprises a base that is connected to the substrate, a torsion element connected to the base and a second element connected to the torsion element through a union angle, wherein the union angle comprises an interface between the torsion element and the second element, wherein the interface comprises a buffer. The buffer may be comprised of several types of materials known in the art, such as, but not limited to NiCo, NiMn, and Au. Preferably a softer/more ductile material such as Au is used for the buffer. Also, the buffer layer can be comprised of a material that is more ductile than the material out of which the second member is constructed.

All three embodiments may be used together or in any combination, to achieve better stress reduction and increased tolerance to fracture failures. Also, all three embodiments may be used in a hybrid probe design, or a pure torsional design.

4. BRIEF DESCRIPTION OF THE DRAWINGS

Figure 3:
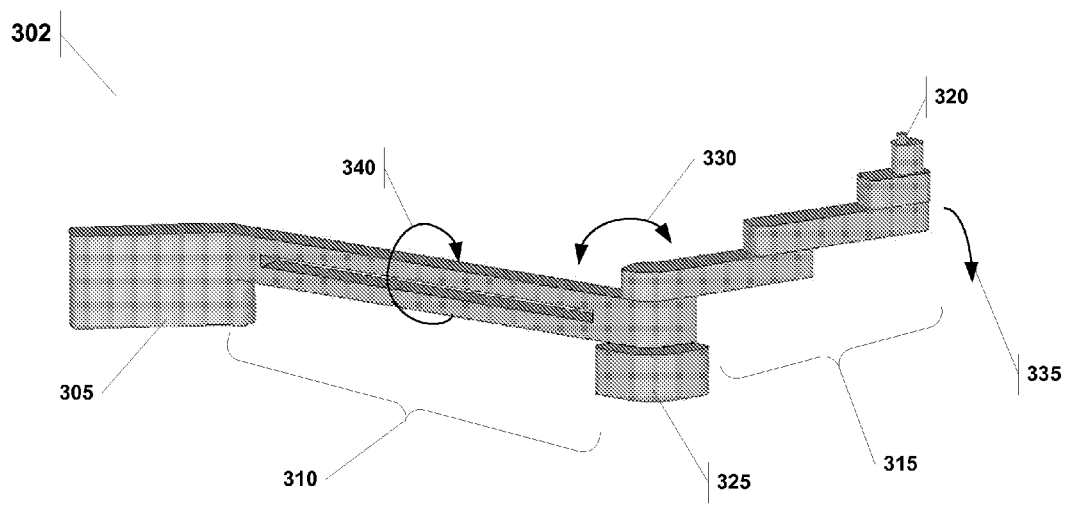

FIG. 3 presents an embodiment of a novel hybrid probe design with a split bar torsion element and a bending element.

Figure 4A:
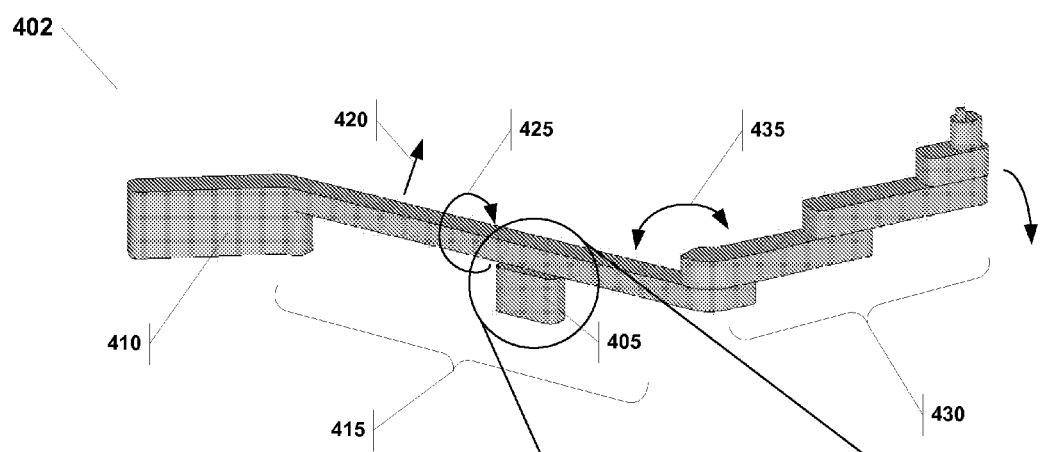
Figure 4B:
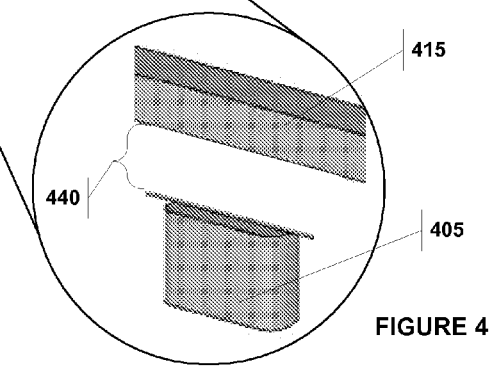

FIGS. 4A and 4B illustrate an embodiment of a novel hybrid probe design with pivot alterations.

Figure 5:
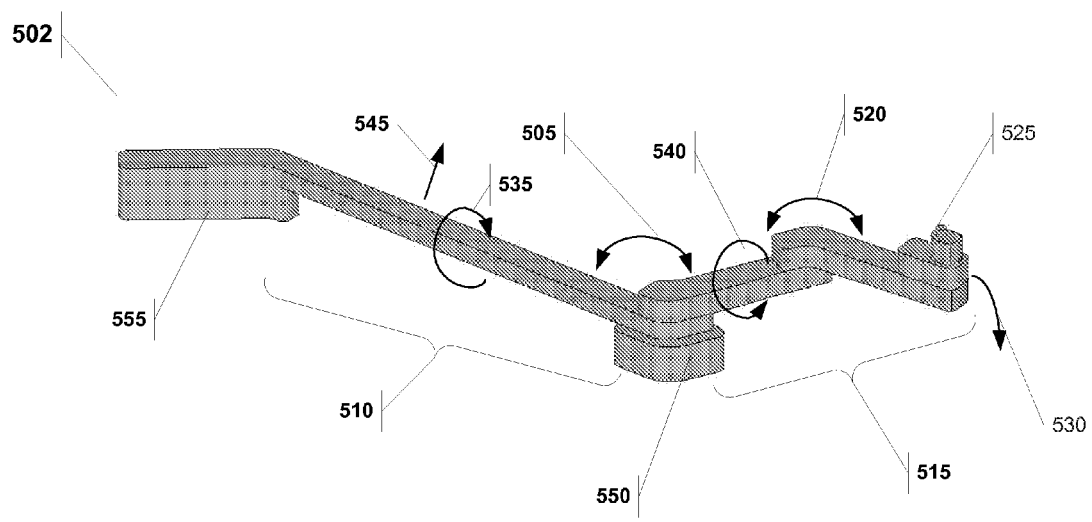

FIG. 5 illustrates an embodiment of a novel hybrid probe design with additional angular elements.

Figure 6:
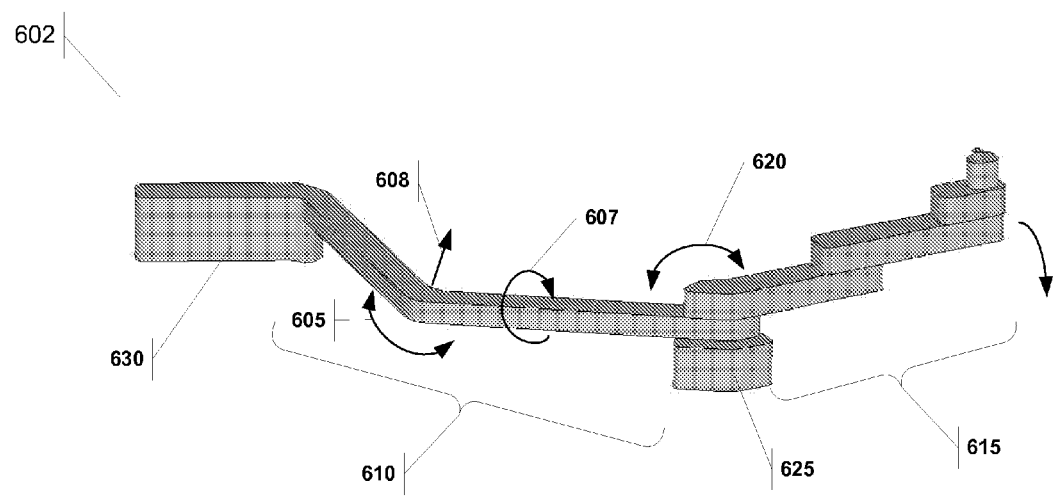

FIG. 6 illustrates an embodiment of a novel hybrid probe design with additional angular elements.

Figure 7A:
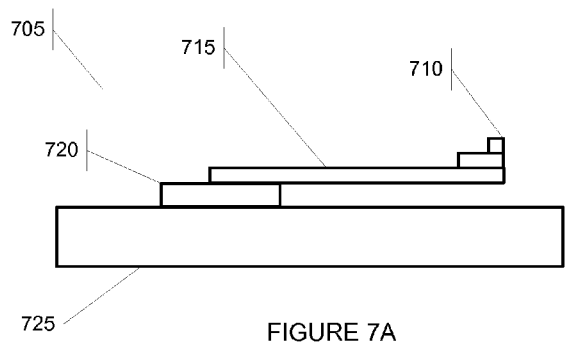
Figure 7B:
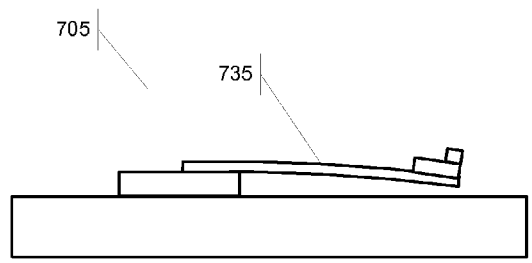

FIGS. 7A and 7B illustrate a cantilever probe.

Figures 8A, 8B:
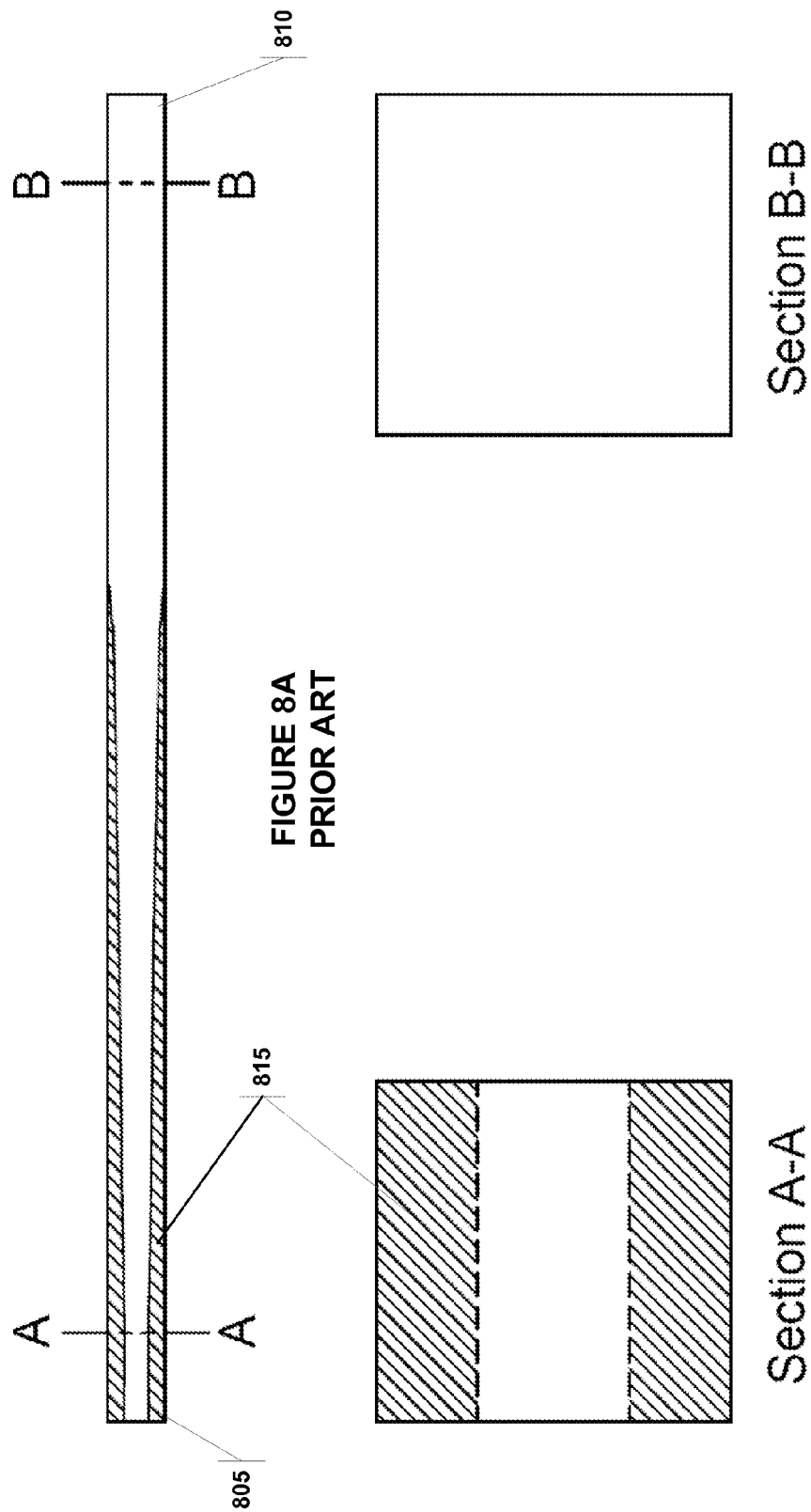
Figure 12B:
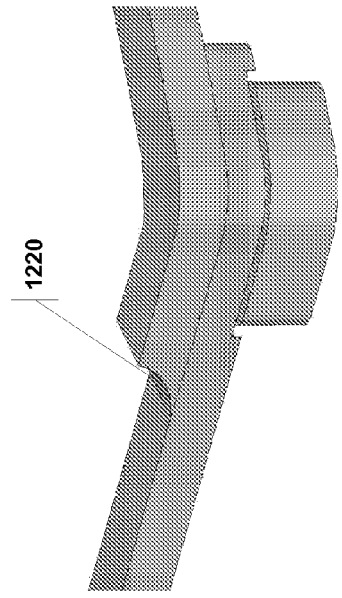
Figure 12D:
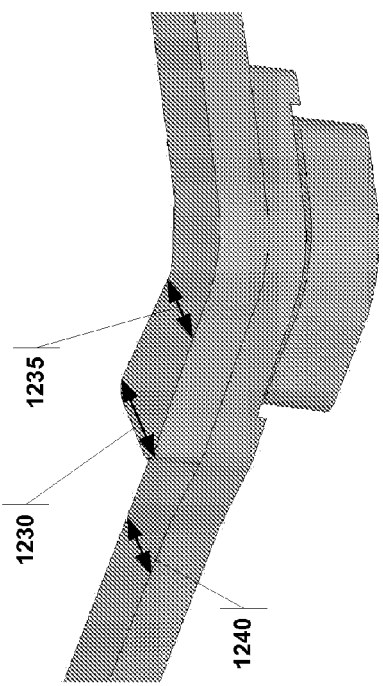
Figure 12A:
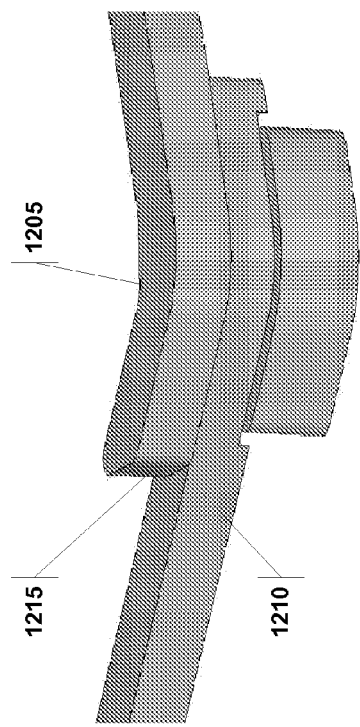
Figure 12C:
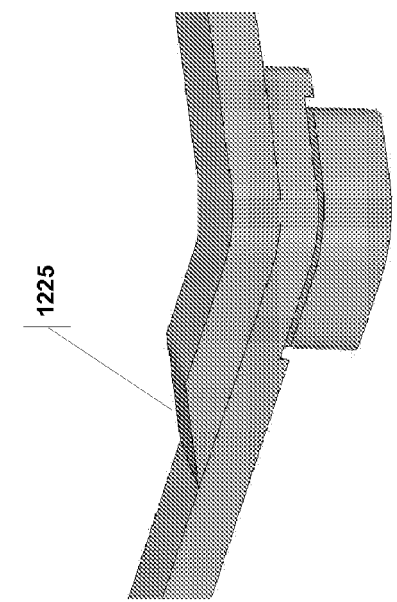

FIGS. 8A and 8B are a length-wise cross-section and width-wise cross-sections, respectively, of the stresses experienced by the bending element of a cantilever probe.

Figure 9:
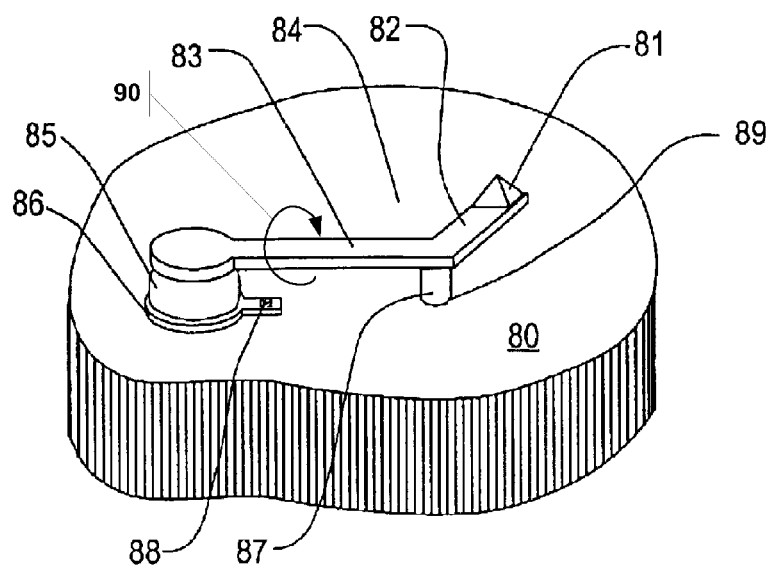

FIG. 9 illustrates a torsional probe.

FIGS. 10A and 10B are a length-wise cross-section and width-wise cross-sections, respectively, of the stresses experienced by the torsion element of a torsional probe.

FIG. 10C depicts a fracture at the union angle.

FIGS. 11A-11C illustrate the stresses experienced by the union angle of a probe.

FIGS. 12A-12D illustrate novel probe structures employing various shapes for the edge of the union angle interface.

FIGS. 13A-13C illustrate a novel probe structure employing a cutout that receives a pivot.

Figure 14:
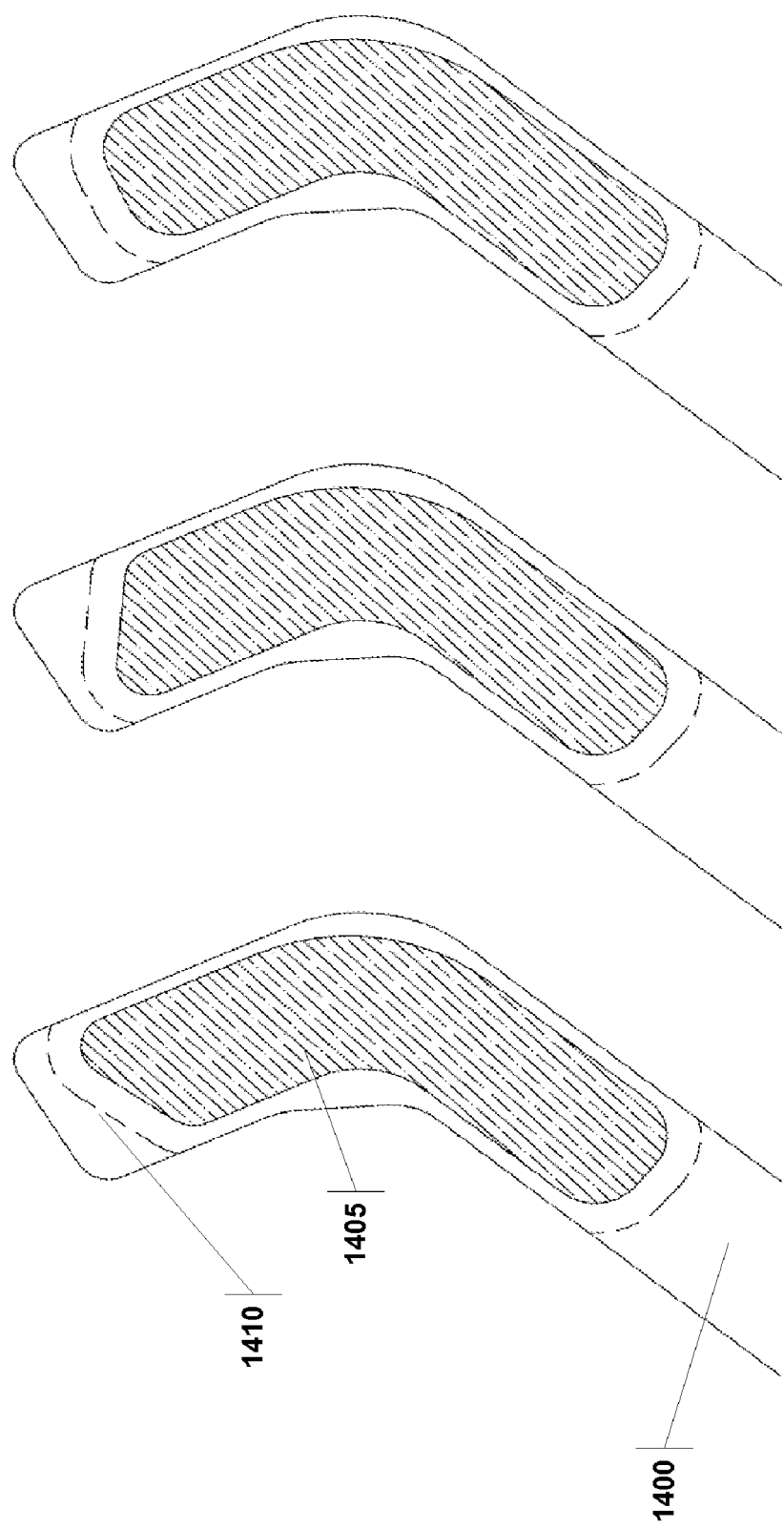

FIG. 14 is a plan view of three different probe structure, pivot and cutout configurations.

FIGS. 15A and 15B illustrate a novel probe structure with a buffer at the union angle interface.

FIGS. 16A and 16B illustrate yet another novel probe structure with a buffer at the union angle interface.

5. DETAILED DESCRIPTION OF THE PREFERRED EMBODIMENTS

What is described below is a novel hybrid probe design that comprises a torsion element and a bending element. Also described below are novel probe designs that incorporate various union angle interface edge shapes, pivot cutouts and buffer layers to prevent failure from stress fractures.

Turning first to the hybrid probe, both the torsion and bending elements allow the hybrid probe to store the displacement energy through torsion and bending. The hybrid design exploits the advantages of both the torsional and cantilever probe designs (i.e., greater packing density, less probe failure from material fatigue, less probe card force, and shorter scrub lengths), while minimizing the disadvantages of a non-hybrid design. The hybrid design can be used to manufacture a probe card that is optimized to a particular application, further increasing the probe card efficiency and cost effectiveness.

Figure 1:
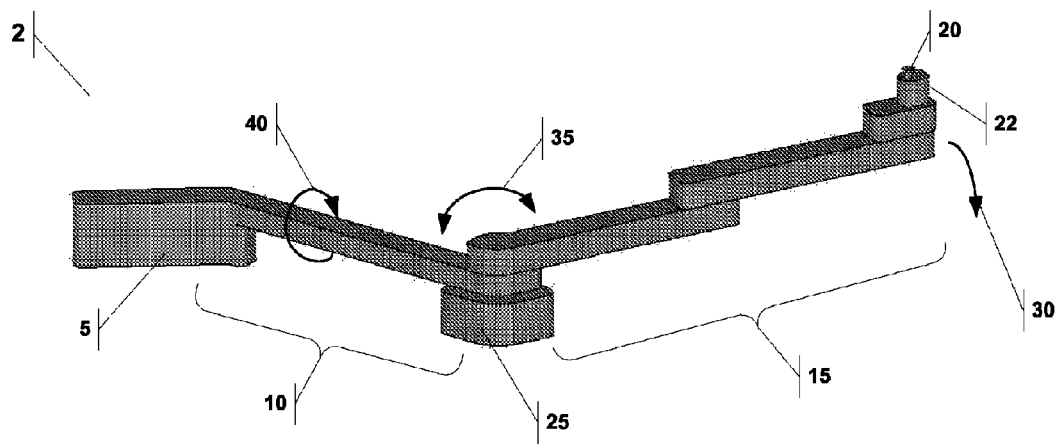
FIG. 1 illustrates an embodiment of a novel hybrid probe design with both torsion and bending elements.

FIG. 1 presents an embodiment of a novel hybrid probe (2). The hybrid probe (2) comprises a probe base (5) connected to the substrate, the torsion element (10), the bending element (15), the probe tip (20) and a probe post (22). A portion of the probe (2) may contact the pivot (25) during touchdown, and the pivot is also connected to the substrate. When the probe tip (20) comes into contact with the DUT contact pad (i.e., during a touchdown), the bending element (15) moves in the direction of arrow 30. The probe (2) must absorb the displacement energy caused by this movement. After the probe (2) completes its testing of the DUT, the stored displacement energy causes the probe (2) to spring back to its original position. Because the torsion element (10) and bending element (15) join at an angle (35), a portion of the displacement energy of the bending element is transferred to the torsion element (10) causing the torsion element (10) to twist in the direction of arrow 40. In this embodiment, angle (35) is about 125 degrees (referenced from 0 degrees in the direction of the torsion element (10)); however, as discussed below, this angle can be adjusted from 90 to 270 to alter the characteristics of the hybrid probe. The bending element (15) is long and thin and thus will have a low moment of inertia and will be able to bend as in a non-hybrid cantilever design, storing a portion of the displacement energy.

The embodiment just described with reference to FIG. 1 contained a short torsion element (10) and a long and thin bending element (15). While this probe (2) on the whole acts like a hybrid, because the bending element has a lower moment of inertia it will act more like a cantilever than a torsional probe. In fact, probe (2) stores displacement energy as both torsion and bending in approximately the following ratio 35:65. Thus, in comparison to a hybrid that acts more torsional (described below), the embodiment in FIG. 1 would have a shorter scrub length and due to its smaller contact angle would present a larger contact area with the DUT contact pad, requiring a larger force to pierce the aluminum oxide layer.

The novel hybrid probe design can be adjusted to meet particular applications. For example, the bending element (15) could be made with a low moment of inertia, such that the hybrid probe (2) will act more like a cantilever probe. Specifically, a bending element (15) with a low moment of inertia would absorb more of the displacement energy, with less of that energy translated to the torsion element (10). This adjustment can be realized by making the bending element (15) longer and/or thinner and also by manipulating the material used (i.e., a material with a low Young's Modulus). With such an adjustment, the novel probe could absorb the displacement energy in a 15:85 torsion/bending ratio. Conversely, the bending element (15) can be constructed with a higher moment of inertia by making it shorter and/or thicker, and also by using a material that is less pliable. These adjustments would shift the energy absorption ratio in favor of torsional energy absorption.

Similarly, the torsion element (10) can be made with a lower polar moment of inertia, such that the hybrid probe (2) will act more like a torsional probe. This adjustment can be realized by making the torsion element (10) longer and/or thinner and also by manipulating the material used (i.e., a material with a low Young's Modulus). A torsion element (10) with a low polar moment of inertia could absorb more of the displacement energy from the bending element (15). In this configuration, the energy absorption ratio could approach 85:15 torsion/bending. Conversely, the torsion element (10) may be manufactured with a high polar moment of inertia by making it from a less pliable material, or the torsion element (10) can be constructed shorter and/or thicker or wider. Increasing the polar moment of inertia would shift the energy absorption in favor of bending energy absorption. Ultimately, using both torsion and bending elements to absorb the displacement energy of the movement is advantageous because the entire probe (2) is used for energy absorption; thus, the probe (2) is less likely to need reinforced, over-engineered components to operate effectively and efficiently.

The probe may be constructed using several techniques, including those described in U.S. patent application Ser. Nos. 11/019,912 and 11/102,982, both commonly owned by the present applicant and hereby also incorporated by reference. Those two applications describe the use of general photolithographic pattern-plating techniques combined with the use of sacrificial metals to further create microstructures such as probes. The probes may be manufactured using several types of materials. The most common of which are nickel alloys that are high performance and preferably plateable. Such alloys may include NiCo and NiMn, with NiMn being more pliable—i.e., the lowest Young's Modulus.

U.S. patent application Ser. No. 11/194,801 teaches forming different parts of the probe during different layers of photolithography, a feature made possible using the photolithography process described in U.S. application Ser. Nos. 11/019,912 and 11/102,982. Using this technique, it is possible to manufacture the various parts of the probe with different materials, which allow for further fine tuning of the hybrid probe characteristics. For example, to obtain a more torsional hybrid probe the torsion element may be made of NiMn (more pliable), while the bending element is made of NiCo (less pliable). Should one desire a more cantilever hybrid then one could exchange this material selection.

U.S. patent application Ser. No. 11/194,801 also teaches a novel probe tip to ensure that the machine vision systems can optically differentiate the probe tip from the probe post. For example, the probe post can be manufactured with a roughened surface. The surface may be roughened prior to lithographically pattern-plating the probe tip on the probe post, so the probe tip is plated directly on the roughened surface. The roughened surface can be formed by plating metals and alloys such as Ni, Ni alloys such as NiMn, NiCo, NiW, or NiFe, W alloys such as CoW, Cr or similar metals at a high current, or by the addition of grain refiners or other additives such as Mn salt in a Ni Sulfamate bath, or in any other manner known in the art of electroplating and electroforming to create a roughened surface. Ultimately, light that is reflected back from the roughened surface is diffused and scattered. This helps the automatic vision systems to resolve the probe tip more clearly by providing greatly improved contrast between the probe tip and the probe post surface(s).

Figure 2:
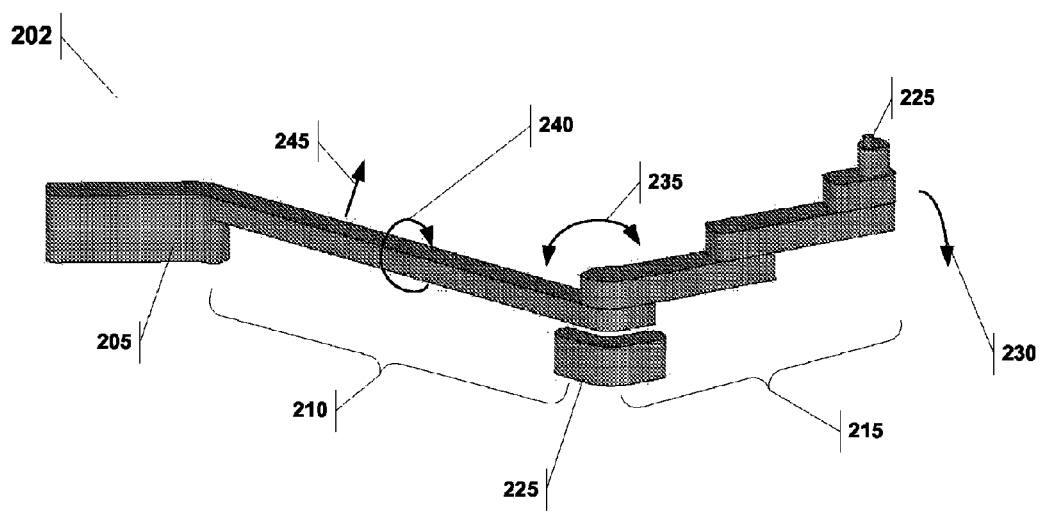
FIG. 2 illustrates an embodiment of a novel hybrid probe design with both torsion and bending elements.

FIG. 2 represents another hybrid probe (202) design in which the torsion and bending elements have been manipulated relative to the embodiment of FIG. 1. The probe (202) comprises a probe base (205) connected to a substrate, a torsion/bending element (210), a bending element (215), and a probe tip (220). A portion of the probe (202) may come into contact with the pivot (225) that is connected to the substrate. When the probe tip (220) contacts the DUT contact pad, the bending element (215) moves in the direction of arrow 230, and the energy from this displacement is translated to the torsion/bending element (210) through the union angle (235), which in this example is again 125 degrees, causing twist in the direction of arrow 240. It would be apparent that the union angle can be adjusted as needed. As compared to the embodiment of FIG. 1, the bending element (215) is shorter which would cause it to have a higher moment of inertia and would bend less. Additionally, the torsion/bending element (210) is longer, causing it to have a lower polar moment of inertia such that the hybrid probe (202) will act more like a torsional probe. It is important to note that the longer torsion/bending element (210) would also have a low moment of inertia such that it could bend in the direction of arrow 245. In addition, the pivot can be placed lower or farther down from the torsion/bending element so that it could bend more in the direction of arrow 245. Thus, the novel hybrid probe need not have two distinct structures that perform the torsion and bending energy absorption; rather those may be performed by a single structure. In this embodiment, probe (202) stores the torsion and bending energy in approximately the following ratio 35:65.

FIG. 3 represents yet another hybrid probe (302) design in which the torsion and bending elements have been modified. The probe (302) comprises a probe base (305) connected to a substrate, a torsion element (310), a bending element (315), and a probe tip (320). A portion of the probe (302) may come into contact with the pivot (325) connected to the substrate. Because of the union angle (330), when the bending element (315) moves in the direction of arrow 335 the displacement energy is translated to the torsion element (310), which then twists in the direction of arrow 340. As compared the embodiment of FIG. 2, the torsion element (310) is shorter and is comprised of a split bar that may allow for a lower amount of polar inertia. The split bar is advantageous because it may be easier to manufacture than a solid bar of the same effective thickness. The hybrid probe (302) of FIG. 3 will allow for more torsional energy absorption than the embodiment described with reference to FIG. 2. Ultimately, probe (302) stores the torsion and bending energy in approximately the following ratio 65:35.

In addition to manipulating moments of inertia for torsion and bending elements, manipulating the placement and height of the pivot can also fine tune the performance of the hybrid probe. FIG. 4A illustrates a hybrid probe (402) that is similar to the probe already described with reference to FIG. 2. The difference is that the placement of the pivot (405) is closer to the probe base (410). This placement causes the torsion/bending element (415) to bend in the direction of arrow 420 more than the probe in FIG. 2. In the pivot's (405) current placement, the torsion/bending element (415) still performs both types of energy absorption (torsional as shown by arrow 425, and bending as shown by arrow 420), and the probe (402), as a whole, stores torsion/bending energy in approximately the following ratio 30:70.

If the pivot (405) were placed immediately next to the probe base (410), then the torsion/bending element (415) would perform very little torsional energy absorption; rather most of the energy would be stored as bending by both the torsion/bending element (415) and the bending element (430). And by placing the pivot (405) in the position immediately below the union angle (435), the torsion/bending element (415) would experience the most torsional energy adsorption. From these two extreme pivot (405) positions, it would be apparent to one of skill in the art that a minor movement of the pivot (405) can fine tune the torsional/bending characteristics of the hybrid probe (402).

FIG. 4B illustrates an enlarged view of the portion of the torsion bending/element (415) that comes into contact with the pivot (405). This embodiment varies from the embodiment shown in FIG. 4A in that the torsion/bending element (415) is placed at a larger gap (440) from the pivot (405). The gap (440) allows the torsion/bending element (415) to bend and store energy through bending as well as torsion. Thus, manipulating the height of the pivot for any of the embodiments described herein also may alter the energy absorption characteristics of the hybrid probe.

FIGS. 5 and 6 illustrate the use of additional angular elements that further fine tune the torsional/bending characteristics of the hybrid probe. Specifically, the probe (502) depicted in FIG. 5 contains an angular union (505) connecting the torsion element (510) to the torsion/bending element (515). The element (515) is both torsion and bending because of the additional angular element (520). When the probe tip (525) contacts the DUT contact pad, the probe tip moves in the direction of arrow 530. The energy from this movement is absorbed by both the torsion element (510) twisting the direction of arrow 535 and by the torsion/bending element (515) bending. Because of the angular element (520), the torsion/bending element (515) also twists in the direction of arrow 540, resulting in a torsion/bending energy absorption of about 40:60 for the probe (502). The torsion element (510) can be modified so as to have a lower moment of inertia, such that this element also bends more in the direction of arrow 545, storing more of the displacement energy as a cantilever. As described above, the pivot (550) may be moved towards the probe base (555) causing the torsion element (510) to bend more allowing for more bending energy storage.

In FIG. 6, the novel hybrid probe (602) includes an additional angular element (605) which causes both torsional and bending energy absorption (shown by arrows 607 and 608, respectively) in element 610. The bending element (615) transfers some of the displacement energy through the union angle (620) to the torsion/bending element (610). A second angular element could be added to the bending element (615), similar to the one described above with reference to FIG. 5, allowing the bending element (615) to also store torsional energy. The position of the pivot (625) can also be adjusted to fine tune the torsional and bending energy absorption. In the current pivot configuration, however, the ratio of the probe's (602) torsion/bending absorption is about 35:65.

The torsional and cantilever characteristics of the novel probe card can be adjusted by manipulating the angle of their union and/or the angle of the additional angular elements. On one extreme, if the angle is near zero then there will be little to no torsion exerted on the torsion element. On the other extreme, if the angle is 90 degrees (or 270 degrees), the torsion element will experience more torsion. From these two extremes, it would be apparent to one of skill in the art that a minor change in the angle can fine tune the torsional/cantilever characteristics of the hybrid probe.

By using the embodiments described herein, it is possible to manufacture a hybrid probe that exploits the advantages of the torsional and cantilever designs. The benefit of both torsional and bending energy absorption is that the probe more efficiently absorbs the displacement energy across more of the probe's volume, thus reducing the need to reinforce the probe. Because the hybrid probe tip will present a smaller contact area than a pure cantilever design to the DUT contact pad (due to the hybrid probe's larger tip contact angle), the hybrid probe would need less force to achieve a reliable electrical contact with the DUT. This results in a probe card that is more efficient and cost effective with higher packing densities, lower failure rates and less probe failure due to material fatigue from excessive stress. Fine tuning the hybrid through pivot placement, additional angular elements, and modifications to moments of inertia, allows for customization to particular applications that further increase the probe card efficiency and cost effectiveness.

Now turning to novel probe designs that incorporate various union angle interface edge shapes, pivot cutouts and buffers to prevent stress fractures, such as those illustrated in FIG. 10D. FIG. 11A illustrates the union angle (1105) of the hybrid probe (1110). At this union the bending element (1115) joins the torsion element (1120), and experiences significant stress. FIGS. 11B and 11C illustrate the stresses that the union angle experiences. Specifically, in FIG. 11B the union angle interface edge between the torsion element (1120) and the bending element (1115) is substantially square, whereas in FIG. 11C the edge is tapered (compare line 1125 to line 1130). FIG. 11B has a very intense point of stress at 1135 (the dark area), while FIG. 11C has the stress more evenly distributed across a large area (1140). By spreading the stress, the union angle is less likely to fracture and fail. Also the stress point of FIG. 11B is on the outer edge, which is more prone to defects and therefore more prone to failure. The different design of the union angle interface edge moves the stressed area more internal to the union which is less prone to defects and fractures. It is important to note that the stresses imparted at the union angle are not unique to hybrid probes, but also afflict pure torsional probes.

In FIG. 12 several union angle interface edge configurations are presented that more efficiently distribute the stress, and these configurations can be used with hybrid as well as pure torsional probe designs. FIG. 12A illustrates the same union angle interface edge as that of FIG. 11B. Note that the edge of the top member (1205) of the union angle is not rectilinear or square with the bottom member (1210), instead the union is tapered or angled back (see position 1215). This particular design can reduce stress upwards of 20%. Of course there are other union angle interface edges that can more evenly and effectively distribute stress. For example, in FIG. 12B the edge of the interface between the top and bottom members (position 1220) is shaped like a snow plough, which allows a larger interface between the top and bottom members. This larger interface reduces the risk of fracture. Similarly, FIG. 12C also has an interface (position 1225) that has larger surface area contact between the top and bottom members, but it is shaped like a triangle. In FIG. 12D, the interface is flared wider than the rest of the structure. The width at the edge of the interface (position 1230) is significantly wider than the width of the top member at 1235 or the width of the bottom member at 1240. This embodiment places more material at the union, which reduces the possibility of fracture and failure. In this particular design, the amount of stress reduction can depend on the amount of flaring—i.e., the difference between the width at position 1230 as compare to the width at position 1235.

FIGS. 13A through 13C illustrate yet another embodiment that helps reduce failure at the union angle. The probe structure (1305) of FIG. 13A contains a union angle that is shown in magnification in FIG. 13B. The union angle (1310) contains a pivot (1315) that fits into a complementary cutout (1320) in the probe structure. The complementary cutout (1320) provides for a thicker bottom member at 1325 (compare thickness at position 1325 to position 1330), the area where the union angle experiences the maximum stress, which reduces the risk of failure. The cutout (1320) also assists in keeping the probe structure (1305) aligned with the pivot; thus reducing operational failure from misalignment with the intended contact pad. The cutout (1320) also allows the probe structure to be constructed closer to the probe card substrate, which can result in reduced manufacturing costs because the probe structure need not be built as high as in the non-cutout configuration. FIG. 13C is another embodiment of the cutout, wherein the cutout (1335) is deeper than the one illustrated in FIG. 13B—i.e., compare thickness at positions 1325 and 1330 of FIG. 13B to thicknesses at position 1340 and 1345 in FIG. 13C. Again, the embodiment including a pivot cutout may be used with a hybrid and pure-torsional probe design.

FIG. 14 illustrates a plan view of three different probe structure and pivots. The leftmost probe structure (1400) comes into contact with the pivot (1405). Dashed line (1410) illustrates the complementary cutout. The middle and right probe structures illustrate other possible shapes for the pivot and cutout. The shape of the pivots may complement the shape of the union angle to help in preventing fracture failures. For example, compare the leftmost pivot (1405) with the shape of the union angle interface edge found in FIG. 12A. Both the pivot and the edge complement each other. This complementary configuration may be helpful in more evenly distributing the stresses experience by the probe structure. As discussed above, the angles shown in FIG. 14 can be altered to affect the scrub and torsional/cantilever characteristics of the hybrid probe.

FIGS. 15A and 15B illustrate yet another embodiment that helps reduce failure at the union angle. The hybrid probe (1505) of FIG. 15A contains a union angle that is shown in magnification in FIG. 15B. The union angle contains a pivot (1510) that fits into a complementary cutout (1515) in the probe structure. Between the top member and bottom member of the union angle is a buffer layer (1520). This layer may be comprised of several types of materials known in the art, such as, but not limited to NiCo, NiMn, and Au. Preferably, a material such as Au may be used, which is more pliable or ductile than the rest of the probe structure and therefore less likely to fracture and less likely to propagate a fracture. The buffer may be used across the entire interface of the top and bottom members, or limited just to the area where fractures are likely to occur as in FIG. 15B. The thickness of buffer layer may vary, but in one embodiment is less than 60% of the top member thickness. Of course the improvement of the buffer layer may be used without the pivot cutout, and may be used in hybrid and pure torsional probe structures as well. The use of a buffer can reduce stress upwards of 30%.

FIGS. 16A and 16B illustrate another embodiment that helps reduce failure at the union angle. The hybrid probe (1605) of FIG. 16A contains a union angle that is shown in magnification in FIG. 16B. The union angle contains a pivot (1610) that fits into a complementary cutout (1615) in the probe structure. Between the top member and bottom member of the union angle is a buffer layer (1620). This layer may be comprised of several types of materials known in the art, such as, but not limited to NiCo, NiMn, and Au. Preferably, a material such as Au may be used, which is more pliable or ductile than the rest of the probe structure and therefore less likely to fracture and less likely to propagate a fracture. The buffer may be used across the entire interface of the top and bottom members, or limited just to the area where fractures are likely to occur as in FIG. 16B. The thickness of buffer layer may vary, but in one embodiment is less than 60% of the top member thickness. Of course the improvement of the buffer layer may be used without the pivot cutout, and may be used in hybrid and pure torsional probe structures as well.

While the embodiments above have been described as separate features—i.e., various interface angle shapes, pivot cutouts and buffers—it would be apparent to one of ordinary skill in the art that a probe card design may incorporate all three or any other combination of these features. By using more than one of the features, it may be possible to achieve better stress reduction and increased tolerance to fracture failures.

While the description above refers to particular embodiments of the present invention, it should be readily apparent to people of ordinary skill in the art that a number of modifications may be made without departing from the spirit thereof. The accompanying claims are intended to cover such modifications as would fall within the true spirit and scope of the invention. The presently disclosed embodiments are, therefore, to be considered in all respects as illustrative and not restrictive, the scope of the invention being indicated by the appended claims rather than the foregoing description. All changes that come within the meaning of and range of equivalency of the claims are intended to be embraced therein. Moreover, the applicants expressly do not intend that the following claims "and the embodiments in the specification to be strictly coextensive." Phillips v. AHW Corp., 415 F.3d 1303, 1323 (Fed. Cir. 2005) (en banc).

The invention claimed is:

1. A probe card for testing a semiconductor device, comprising:
   a substrate;
   a probe connected to the substrate, the probe comprising
      a base that is connected to the substrate;
      a torsion element connected to the base;
      a second element connected to the torsion element through a union angle, wherein the union angle comprises an interface between the torsion element and the second element wherein the edge of the interface is shaped to diffuse stress; and
   a pivot connected to the substrate, wherein a portion of the probe contacts the pivot.

2. The probe card of claim 1 wherein the shape of the interface edge is selected from a group consisting of a plough, a triangle, a taper, a flare and combinations thereof.

3. The probe card of claim 1 wherein the probe comprises a cutout and the pivot contacts the probe at the cutout.

4. The probe card of claim 3 wherein the shape of the cutout is complementary to the shape of the pivot.

5. The probe card of claim 3 wherein the cutout is located at the union angle.

6. The probe card of claim 1 wherein the interface further comprises a buffer.

7. The probe card of claim 6, wherein the buffer is comprised of a material selected from a group consisting of: NiCo and NiMn, Au and combinations thereof.

8. The probe card of claim 6 wherein the buffer is comprised of a material that is more ductile than the material out of which the second member is constructed.

9. The probe card of claim 1 wherein the probe is a torsional design.

10. The probe card of claim 1 wherein the probe is a hybrid design.

11. A probe card for testing a semiconductor device, comprising:
   a substrate;
   a probe connected to the substrate, the probe comprising a cutout; and
   a pivot connected to the substrate, wherein the pivot contacts the probe at the cutout.

12. The probe card of claim 11 wherein the shape of the cutout is complementary to the shape of the pivot.

13. The probe card of claim 11 wherein the probe comprises a torsion element connected to a second element through a union angle, wherein the cutout is located at the union angle.

14. The probe card of claim 13, the union angle comprising an interface between the torsion element and the second element, wherein the edge of the interface is shaped to diffuse stress; wherein the shape of the cutout is complementary to the shape of the interface.

15. The probe card of claim 14 wherein the shape of the interface edge is selected from a group consisting of: a plough, a triangle, a taper, a flare and combinations thereof.

16. The probe card of claim 14 wherein the interface further comprises a buffer.

17. The probe card of claim 16 wherein the buffer is comprised of a material selected from a group consisting of: NiCo and NiMn, Au and combinations thereof.

18. The probe card of claim 16 wherein the buffer is comprised of a material that is more ductile than the material out of which the second member is constructed.

19. The probe card of claim 11 wherein the probe is a torsional design.

20. The probe card of claim 11 wherein the probe is a hybrid design.

21. A probe card for testing a semiconductor device, comprising:
   a substrate;
   a probe connected to the substrate, the probe comprising
      a base that is connected to the substrate;
      a torsion element connected to the base;
      a second element connected to the torsion element through a union angle, wherein the union angle comprises an interface between the torsion element and the second element, wherein the interface comprises a buffer; and
   a pivot connected to the substrate, wherein a portion of the probe contacts the pivot.

22. The probe card of claim 21 wherein the buffer is comprised of a material selected from a group consisting of: NiCo and NiMn, Au and combinations thereof.

23. The probe card of claim 21 wherein the buffer is comprised of a material that is more ductile than the material out of which the second member is constructed.

24. The probe card of claim 21 wherein the probe comprises a cutout and the pivot contacts the probe at the cutout.

25. The probe card of claim 24 wherein the shape of the cutout is complementary to the shape of the pivot.

26. The probe card of claim 24 wherein the cutout is located at the union angle.

27. The probe card of claim 21, wherein the edge of the interface is shaped to diffuse stress, and the shape is selected from a group consisting of: a plough, a triangle, a taper, a flare and combinations thereof.

28. The probe card of claim 21 wherein the probe is a torsional design.

29. The probe card of claim 21 wherein the probe is a hybrid design.

* * * * *